United States Patent [19]

Nakano

[11] Patent Number: 5,835,432
[45] Date of Patent: Nov. 10, 1998

[54] SEMICONDUCTOR MEMORY HAVING A SINGLE END TYPE SENSE AMPLIFIER

[75] Inventor: Toshihiko Nakano, Tokyo, Japan

[73] Assignee: NEC Corporation, Tokyo, Japan

[21] Appl. No.: 691,394

[22] Filed: Aug. 2, 1996

[30] Foreign Application Priority Data

Aug. 11, 1995 [JP] Japan .................................. 7-205830

[51] Int. Cl.⁶ ...................................................... G11C 7/00
[52] U.S. Cl. .......................................... 365/205; 365/204
[58] Field of Search ............................. 327/57; 365/205, 365/204

[56] References Cited

U.S. PATENT DOCUMENTS 4,811,290  3/1989  Watanabe ................................ 365/205
5,119,334  6/1992  Fujii ....................................... 365/204
5,297,078  3/1994  Yamaguchi ............................ 365/204

FOREIGN PATENT DOCUMENTS 4-47599  2/1992  Japan .
5-54652  3/1993  Japan .

Primary Examiner—David C. Nelms
Assistant Examiner—Michael T. Tran
Attorney, Agent, or Firm—Young & Thompson

[57] ABSTRACT

A semiconductor memory has a bit line connected to a plurality of memory cells and a single end type sense amplifier connected to the bit line. The single end type sense amplifier has an invertor whose input node is connected to the bit line, a precharge circuit precharging the bit line in response to a precharge signal, a control signal generator generating a control signal in response to an output signal from the invertor, and a discharge circuit discharging the bit line in response to the control signal.

15 Claims, 4 Drawing Sheets

SEMICONDUCTOR MEMORY HAVING A SINGLE END TYPE SENSE AMPLIFIER

BACKGROUND OF THE INVENTION

1. Field of the Invention

The present invention relates to a semiconductor memory, and more particularly to a semiconductor memory employing a single end type sense amplifier which amplifies read data on a single bit line from a memory cell during a read operation.

2. Description of Related Art

In general, two types of sense amplifiers are known for a semiconductor memory such as a DRAM, an SRAM or the like, i.e., a differential type sense amplifier and a single end type sense amplifier. The differential type sense amplifier is connected to a pair of bit lines to receive complementary signals from a memory cell so that it detects and amplifies a difference of a potential of the pair of bit lines connected thereto during a read operation. On the other hand, the single end type sense amplifier is connected to a single bit line to receive a read signal from a memory cell so that it detects whether a potential of the read signal on the bit line connected thereto is higher or lower than a predetermined potential.

Although the single end type sense amplifier is inferior to the differential type sense amplifier in sensitivity and speed, the single end type sense amplifier has an advantage that each sense amplifier requires only one bit line to detect a content of the memory cell, so that it is superior to the differential type sense amplifier in integration density.

As mentioned above, the single end type sense amplifier detects a content of a memory cell based on the single bit line connected thereto. The potential of the bit line connected to the single end type sense amplifier is determined by the stored data into the selected memory cell during a read operation, i.e., the potential of the bit line is maintained at a precharge level when the selected memory cell stores one logic level, for example, "1" logic level, so that a discharge path between the bit line and the ground is not formed in the memory cell, and the potential of the bit line is lowered when the selected memory cell stores the other logic level, for example, "0" logic level, so that the discharge path is formed in the memory cell.

However, the transistor within the memory cell is generally very small. As a result, it takes a long time to lower the potential of the bit line when the other logic level ("0" logic level) is read from the selected memory cell during the read operation. Namely, the fall of the potential of the bit line is too gradual. Therefore, there is a problem in such a semiconductor memory that it is difficult to shorten a read cycle time.

SUMMARY OF THE INVENTION

It is therefore an object of the present invention to provide an improved semiconductor memory employing a single end type sense amplifier.

It is another object of the present invention to provide a semiconductor memory having a single end type sense amplifier, which allows the semiconductor memory to perform a read operation at relatively short cycle time.

It is a further object of the present invention to provide a semiconductor memory having a single end type sense amplifier with low power consumption.

It is still another object of the present invention to provide a semiconductor memory having a single end type sense amplifier which can perform a stable read operation despite noise on a bit line connected thereto.

A semiconductor memory according to the present invention employs a single end type sense amplifier having a voltage detector detecting a voltage of a bit line connected thereto and a discharge circuit discharging the bit line in response to an output signal from the voltage detector.

More specifically, the semiconductor memory according to the present invention employs a single end type sense amplifier having an invertor as a voltage detector whose input node is connected to a bit line, a precharge circuit precharging the bit line in response to a precharge signal, a control signal generator generating a control signal in response to an output signal from the invertor and a discharge circuit discharging the bit line in response to the control signal.

Thus, according to the present invention, the voltage of the bit line is lowered rapidly through the discharge circuit after the voltage of the bit line exceeds a threshold voltage of the invertor during a read operation. That is, because the period after the voltage of the bit line exceeds a threshold voltage of the invertor is shortened, a semiconductor memory performing a read operation at a short cycle time is obtained.

BRIEF DESCRIPTION OF THE DRAWINGS

This above and other objects, features and advantages of the present invention will become more apparent by reference to the following detailed description of the present invention taken in conjunction with the accompanying drawings, wherein.

DESCRIPTION OF THE PREFERRED EMBODIMENTS

Figure 1:
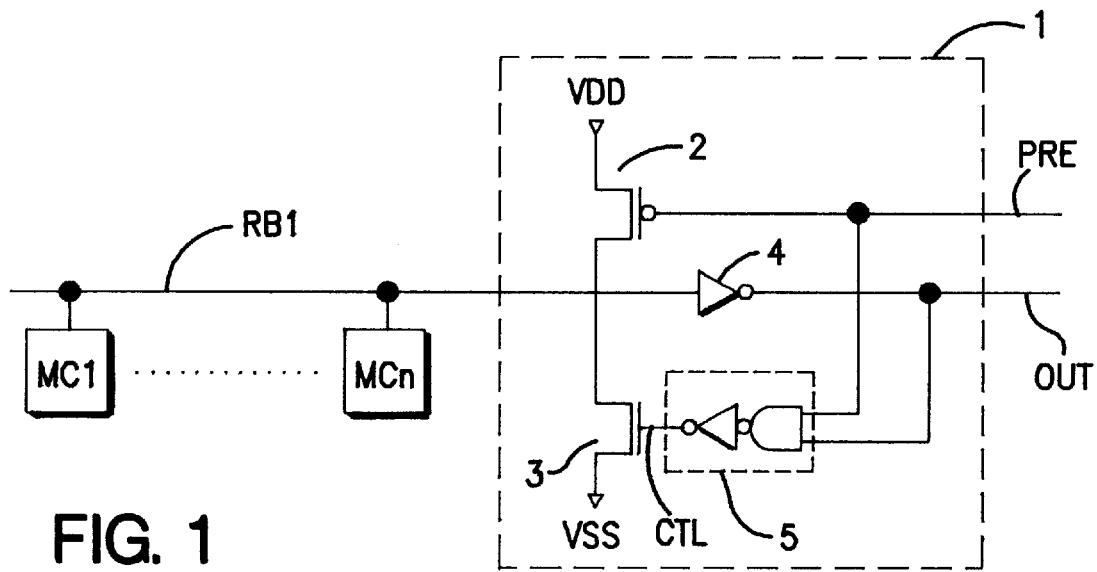
FIG. 1 is a schematic circuit diagram showing a semiconductor memory employing a single end type sense amplifier according to a first embodiment of the present invention.

Referring to FIG. 1, a semiconductor memory according to the first embodiment of the present invention has a read bit line RB1 connected to a plurality of memory cells MC1-MCn and a single end type sense amplifier 1 connected to the read bit line RB1 and an output signal line OUT. The sense amplifier 1 is also connected to a precharge line PRE.

Each of the memory cells may be any type of memory cell as long as it maintains a voltage of the read bit line RB1 at a precharge level when one logic level, for example, "1" logic level, is read therefrom during a read operation, and lowers or raises the voltage of the read bit line RB1 when the other logic level, for example, "0" logic level is read therefrom during the read operation. For example, a memory cell and interconnection between the memory cell and the read bit line shown in FIG. 2 is preferable.

Figure 2:
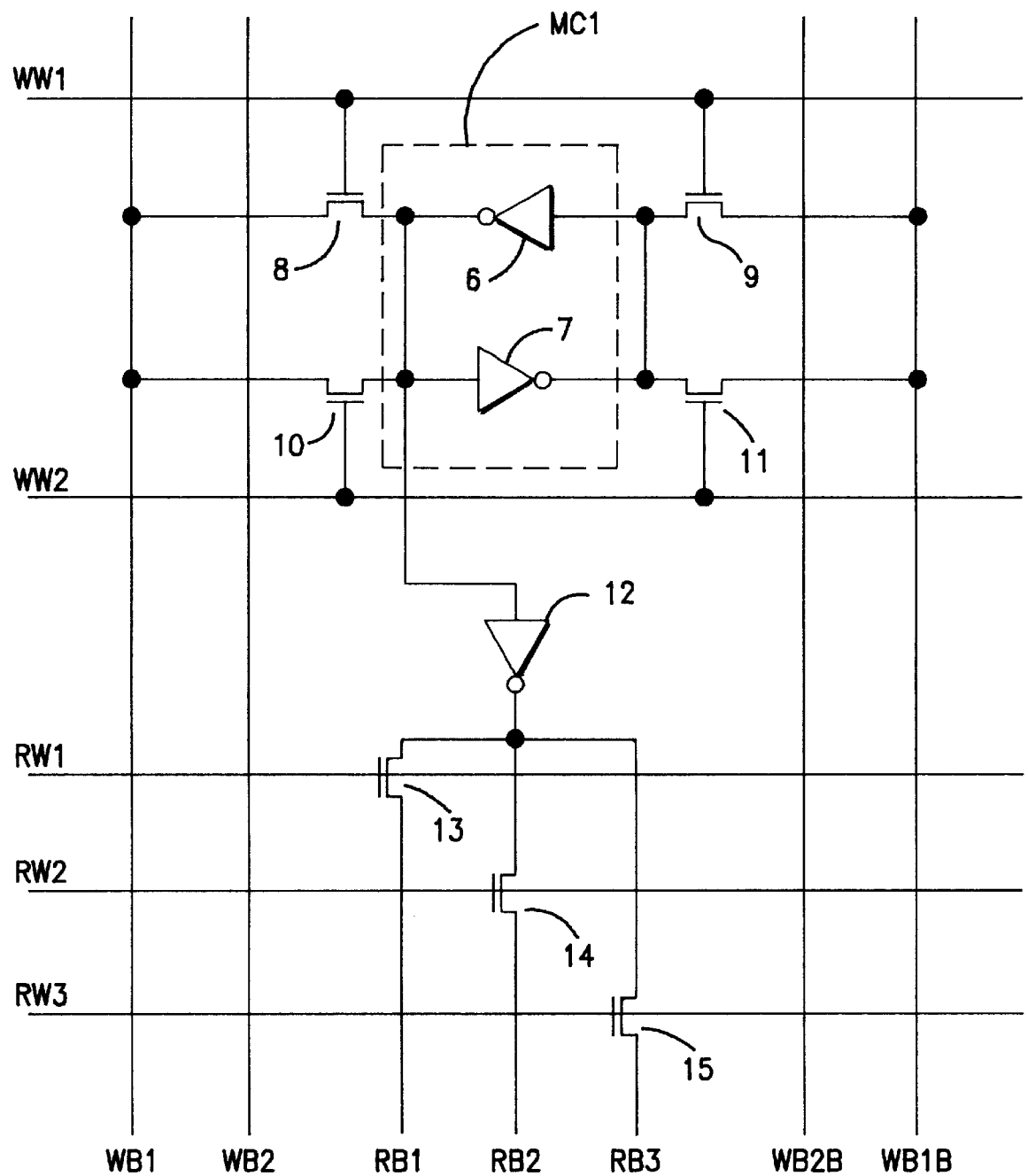
FIG. 2 is a circuit diagram showing one example of an interconnection between the memory cell and the bit line shown in FIG. 1.

Referring now to FIG. 2, the memory cell MC1 consists of two invertors 6 and 7, i.e., an SRAM cell, and the memory cell MC1 is electrically coupled to read bit lines RB1, RB2 and RB3 through an invertor 12 and corresponding transistors 13–15 in response to corresponding read word lines RW1, RW2 and RW3 being activated. The memory cell MC1 is also electrically coupled to pairs of write bit lines, i.e., one pair of which are labeled WB1 and WB1B, and the other pair of which are labeled WB2 and WB2B, through corresponding transistors 8–11 in response to corresponding write word lines WW1 and WW2 being activated. For example, assuming that the state of the invertor 6 outputting the Vss level (low level) and the invertor 7 outputting the Vdd level (high level) means "1" logic state and the opposite state means "0" logic state, when the read word line RW1 is activated in the case that the memory cell MC1 stores "1" logic state, the read bit line RB1 is connected to the Vdd power source through a transistor constituting the invertor 12. On the contrary, when the read word line RW1 is activated in the case that the memory cell MC1 stores "0" logic state, the read bit line RB1 is connected to the Vss power source through another transistor constituting the invertor 12.

Figure 3:
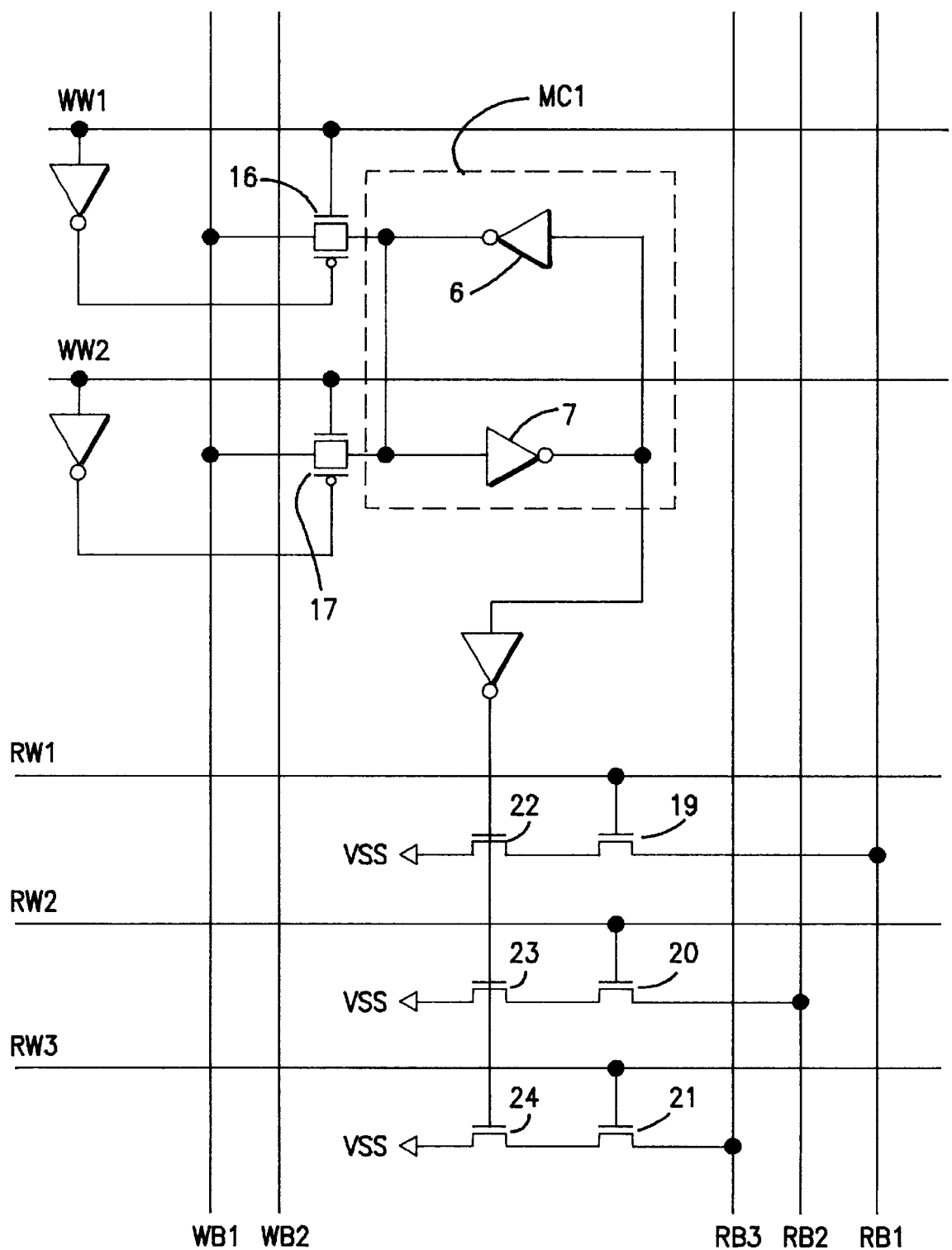
FIG. 3 is a circuit diagram showing another example of an interconnection between the memory cell and the bit line shown in FIG. 1.

An interconnection between the memory cell MC1 and the read bit line RB1 shown in FIG. 3 is also preferable. Referring to FIG. 3, the memory cell MC1 is electrically coupled to gate electrodes of transistors 22–24, and each of the read bit lines RB1–RB3 are electrically coupled to the Vss power source through corresponding transistors 19–21 and 22–24. For example, when the read word line RW1 is activated when the memory cell MC1 stores "0" logic state, the read bit line RB1 is connected to the Vss power source through the transistors 19 and 22. On the contrary, when the read word line RW1 is activated when the memory cell MC1 stores "1" logic state, the read bit line RB1 is not connected to the Vss power source to maintain the previous voltage on the read bit line RB1. Moreover, in the circuit shown in FIG. 3, the number of write bit lines are reduced.

Returning now to FIG. 1, the sense amplifier 1 has a P-channel MOS transistor 2 connected between the Vdd power source and the read bit line RB1 and a N-channel MOS transistor 3 connected between the Vss power source and the read bit line RB1. The sense amplifier also has an invertor 4 whose input node is connected to the read bit line RB1 and output node is connected to the output signal line OUT and an AND gate 5. The AND gate 5 supplies a control signal CTL to a gate electrode of the transistor 3. A gate electrode of the transistor 2 is connected to the precharge line PRE. That is, the transistor 2 is a precharge transistor precharging the read bit line RB1 to Vdd level. Therefore, it is preferable that the transistor 2 is larger than a transistor constituting the invertor 12 shown in FIG. 2 or the transistors 19–24 shown in FIG. 3. Preferably, the transistor 3 is also larger than a transistor constituting the invertor 12 or the transistors 19–24, and more preferably, the transistor 3 has current driving capacity substantially the same capacity as the transistor 2.

Figure 4:
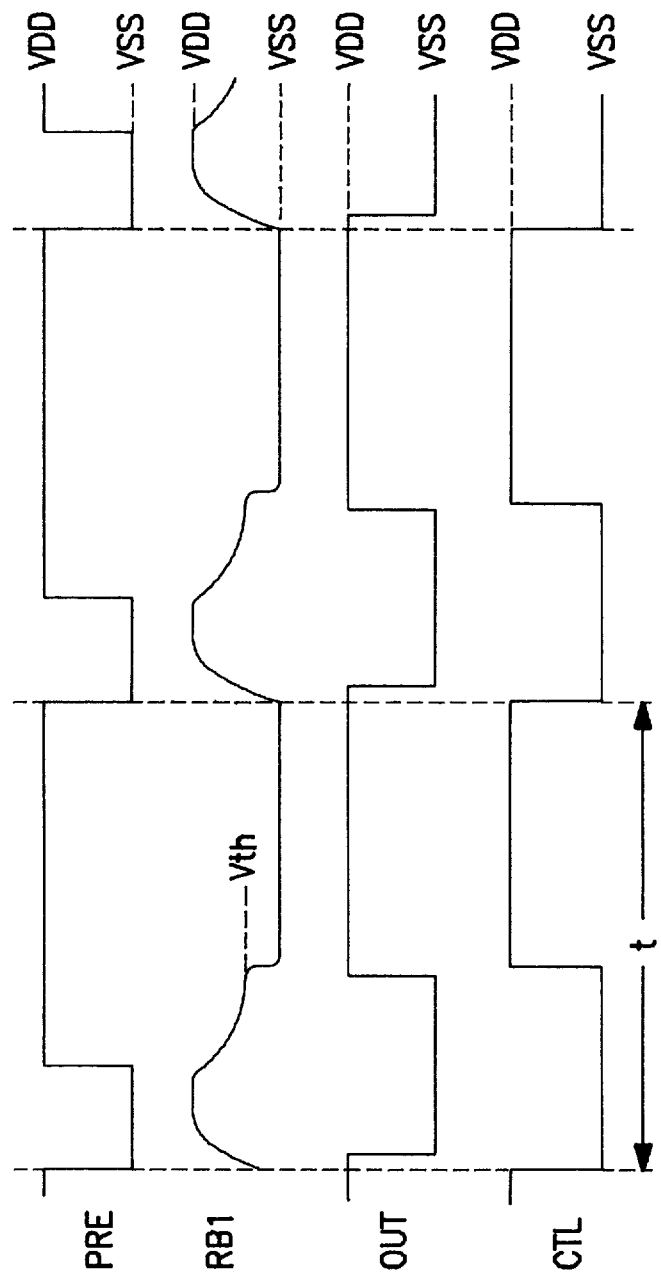
FIG. 4 is a voltage waveform diagram according to the first and second embodiments.

Next, an operation of the semiconductor memory shown in FIG. 1 will be explained with reference to FIG. 4. In FIG. 4, one read cycle is indicated by t, and a threshold voltage of the invertor 4 is indicated by Vth.

First, when a precharge clock on the precharge line PRE assumes the Vss level (low level) from the Vdd level (high level), the transistor 2 is turned ON. Further, since the output of the AND gate 5 outputs Vss level (low level), the transistor 3 is in an OFF state during this period. Accordingly, the potential of the read bit line RB1 is raised to the Vdd level (high level) during this period. Then, when the potential of the read bit line RB1 exceeds the threshold voltage of the invertor 4, the potential on the output signal line OUT changes from the Vdd level (high level) to the Vss level (low level).

After the potential of the read bit line RB1 is raised sufficiently, the precharge clock on the precharge line PRE changes from the Vss level (low level) to the Vdd level (high level), so that the transistor 2 is turned OFF to become non-conductive state. The transistor 3 is still in an OFF state since the potential of the output signal line OUT is at the Vss level (low level).

Thereafter, when the read word line RW1 is activated, the memory cell MC1 and read bit line RB1 are selected. Assuming that the memory cell MC1 stores "0" logic state, a discharging of the read bit line RB1 is occurred through the transistor constituting the invertor 12 shown in FIG. 2 or the transistors 19 and 22 shown in FIG. 3. That is, the potential of the read bit line RB1 gradually changes to the Vss level (low level) from the Vdd level (high level), as shown in FIG. 4. When the potential of the read bit line RB1 falls below the threshold voltage Vth of the invertor 4, the output signal on the output signal line OUT changes to the Vdd level (high level).

When the output signal on the output signal line OUT changes to the Vdd level (high level), the control signal assumes the Vdd level (high level) to turn on the transistor 3. Then, the transistor 3 discharges the read bit line RB1 rapidly because the read bit line RB1 is discharged by not only the transistor constituting the invertor 12 or the transistors 19 and 22 but also the transistor 3. Thereafter, when data read-out from the output signal line OUT is completed, this read cycle is terminated and the precharge clock changes Vss level (low level) again to enter the next read cycle.

On the other hand, assuming that the memory cell MC1 stores "1" logic state, the potential of the read bit line RB1 is maintained at precharge level, i.e., the Vdd level (high level). In this case, since the output signal on the output signal line OUT is maintained at the Vss level (low level), the transistor 3 is kept in the OFF state, and no discharge from the read bit line RB1 occurs (this case is not shown in FIG. 4).

As described above, the semiconductor memory according to the first embodiment of the present invention can shorten the read cycle time because the period the voltage of the bit line exceeds the threshold voltage of the invertor is shortened. Furthermore, since the period of the read bit line having the intermediate potential is shortened, a through current passing the invertor 4 is reduced, and it becomes resistant to the influence of noise on the read bit line RB1.

Next, a semiconductor memory according to the second embodiment of the present invention will be explained with reference to FIG. 5.

Figure 5:
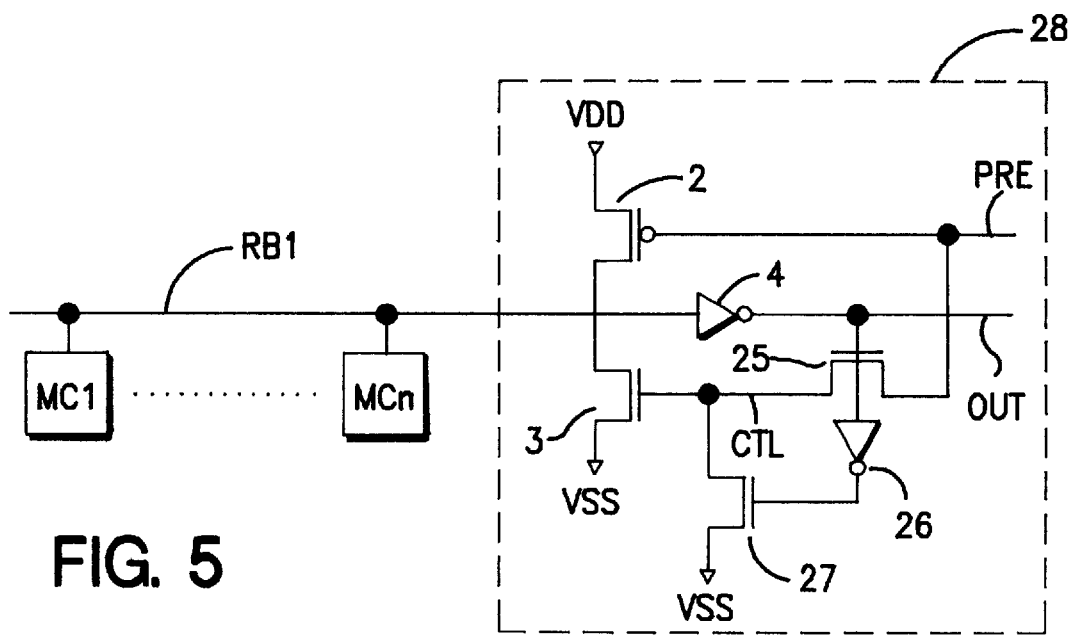
FIG. 5 is a schematic circuit diagram showing a semiconductor memory employing a single end type sense amplifier according to a second embodiment of the present invention.

Referring to FIG. 5, a semiconductor memory according to the second embodiment of the present invention has a single end type sense amplifier 28 instead of the sense amplifier 1 according to the first embodiment. The sense amplifier 28 has the P-channel MOS transistor 2, the N-channel MOS transistor 3 and the invertor 4, similar to the sense amplifier 1. The sense amplifier 28 also has a N-channel MOS transistor 25 connected between the precharge line PRE and the gate electrode of the transistor 3, an invertor 26 whose input node is connected to the output signal line OUT and a N-channel MOS transistor 27 connected between the Vss power source and the gate electrode of the transistor 3. A gate electrode of the transistor 25 is connected to the output signal line OUT, and a gate electrode of the transistor 27 is connected to an output node of the invertor 26.

The operation of the sense amplifier 28 is the same operation as the sense amplifier 1. However, the sense amplifier 28 can be constituted of only four transistors and two invertors, i.e., it can be constituted of eight transistors, which is less than the number of transistors constituting the sense amplifier 1 according to the first embodiment. Therefore, according to the second embodiment, the semiconductor memory employing the smaller number of transistors is obtained.

It is apparent that the present invention is not limited to the above embodiments but may be changed and modified without departing from the scope and spirit of the invention.

What is claimed is:

1. A sense amplifier for a semiconductor memory having a bit line, comprising:
    a voltage detector having an input node coupled to said bit line and an output node, said voltage detector outputting an output signal on said output node responsive to a potential on said input node;
    a precharge circuit, coupled to said bit line, precharging said bit line in response to a precharge signal; and
    a discharge circuit, coupled to said bit line and said output node of said voltage detector, discharging said bit line in response to said output signal and said precharge signal.

2. The sense amplifier as claimed in claim 1, further comprising a first power source, said precharge circuit including a first transistor having a gate electrode supplied with said precharge signal, said first transistor being coupled between said bit line and said first power source.

3. A semiconductor memory having a first power source and a second power source, comprising:
    a bit line;
    a memory cell electrically connected to said bit line;
    a first invertor having an input node electrically connected to said bit line and an output node, said first invertor outputting an output signal to said output node;
    a first transistor electrically connected between said first power source and said bit line, said first transistor having a gate electrode supplied with a precharge signal;
    a control signal generator generating a control signal based on said precharge signal and said output signal; and
    a second transistor electrically connected between said second power source and said bit line, said second transistor having a gate electrode supplied with said control signal.

4. The semiconductor memory as claimed in claim 3, wherein said memory cell is an SRAM cell.

5. A single end type sense amplifier for a semiconductor memory having a bit line, comprising:
    means coupled to said bit line for supplying an output signal based on a potential on said bit line;
    means coupled to said bit line for precharging said bit line based on a precharge signal; and
    means coupled to said bit line for discharging said bit line based on said output signal and said precharge signal.

6. A single end type sense amplifier for a semiconductor memory having a bit line, comprising:
    means coupled to said bit line for supplying an output signal based on a potential on said bit line;
    means coupled to said bit line for precharging said bit line based on a precharge signal; and
    means coupled to said bit line for discharging said bit line based on said output signal and said precharge signal,
    wherein said supplying means includes an invertor having an input node coupled to said bit line and an output node supplying said output signal.

7. The single end type sense amplifier as claimed in claim 6, wherein said precharging means includes a first transistor coupled to said bit line and controlled by said precharge signal.

8. The single end type sense amplifier as claimed in claim 7, wherein said discharging means includes a control signal generator supplied with said output signal and said precharge signal and generating a control signal based on said output signal and said precharge signal and a second transistor coupled to said bit line and controlled by said control signal.

9. The single end type sense amplifier as claimed in claim 8, wherein said first transistor is a P-channel MOS transistor, said second transistor is a N-channel MOS transistor.

10. A sense amplifier for a semiconductor memory having a bit line, comprising:
    a voltage detector having an input node coupled to said bit line and an output node, said voltage detector outputting an output signal on said output node responsive to a potential on said input node;
    a precharge circuit, coupled to said bit line, precharging said bit line in response to a precharge signal; and
    a discharge circuit, coupled to said bit line and said output node of said voltage detector, discharging said bit line in response to said output signal and said precharge signal,
    wherein said voltage detector has a threshold voltage, said voltage detector outputting said output signal on said output node taking a first logic level when the potential on said input nod is higher than said threshold voltage, said voltage detector outputting said output signal on said output node taking a second logic level different from said first logic level when the potential on said input node is lower than said threshold voltage.

11. The sense amplifier as claimed in claim 10, further comprising a first power source, said precharge circuit including a first transistor having a gate electrode supplied with said precharge signal, said first transistor being coupled between said bit line and said first power source; and
    a second power source, said discharge circuit including an AND gate and a second transistor having a gate electrode, said second transistor being coupled between said bit line and said second power source, and said AND gate having a first input node supplied with said precharge signal, a second input node supplied with said output signal and an output node connected to said gate electrode of said second transistor.

12. The sense amplifier as claimed in claim 10, further comprising a first power source, said precharge circuit including a first transistor having a gate electrode supplied with said precharge signal, said first transistor being coupled between said bit line and said first power source; and
    a second power source, said discharge circuit including a second transistor connected between said bit line and said second power source, a third transistor connected between said gate electrode of said first transistor and a gate electrode of said second transistor, a fourth transistor connected between said second power source and said gate electrode of said second transistor and an invertor having an input node connected to said output node of said voltage detector and an output node connected to a gate electrode of said fourth transistor.

13. A sense amplifier for a semiconductor memory having a bit line, comprising:

a voltage detector having an input node coupled to said bit line and an output node, said voltage detector outputting an output signal on said output node responsive to a potential on said input node;

a precharge circuit, coupled to said bit line, precharging said bit line in response to a precharge signal; and a discharge circuit, coupled to said bit line and said output node of said voltage detector, discharging said bit line in response to said output signal and said precharge signal, wherein said voltage detector has an invertor.

14. A semiconductor memory having a first power source and a second power source, comprising:

a bit line;

a memory cell electrically connected to said bit line;

a first invertor having an input node electrically connected to said bit line and an output node, said first invertor outputting an output signal to said output node;

a first transistor electrically connected between said first power source and said bit line, said first transistor having a gate electrode supplied with a precharge signal;

a control signal generator generating a control signal based on said precharge signal and said output signal; and a second transistor electrically connected between said second power source and said bit line, said second transistor having a gate electrode supplied with said control signal, wherein said control signal generator includes an AND gate having a first input node supplied with said precharge signal, a second input node supplied with said output signal, and an output node supplying said control signal.

15. A semiconductor memory having a first power source and a second power source, comprising:

a bit line;

a memory cell electrically connected to said bit line;

a first invertor having an input node electrically connected to said bit line and an output node, said first invertor outputting an output signal to said output node;

a first transistor electrically connected between said first power source and said bit line, said first transistor having a gate electrode supplied with a precharge signal;

a control signal generator generating a control signal based on said precharge signal and said output signal; and a second transistor electrically connected between said second power source and said bit line, said second transistor having a gate electrode supplied with said control signal, wherein said control signal generator includes a second invertor having an input node supplied with said output signal and an output node, a third transistor electrically connected between said gate electrode of said first transistor and said gate electrode of said second transistor having a gate electrode supplied with said output signal and a fourth transistor electrically connected between said second power source and said gate electrode of said second transistor having a gate electrode electrically connected to said output node of said second invertor.

* * * * *